United States Patent [19]
Lewis

[11] Patent Number: 5,572,118
[45] Date of Patent: Nov. 5, 1996

[54] CHARGE RATE ELECTROMETER INCLUDING MEANS FOR SUBSTANTIALLY ELIMINATING LEAKAGE CURRENTS

[75] Inventor: John F. Lewis, Malden, Mass.

[73] Assignee: MKS Instruments, Inc., Andover, Mass.

[21] Appl. No.: 496,635

[22] Filed: Jun. 29, 1995

[51] Int. Cl.$^6$ .................................................. G01R 17/06
[52] U.S. Cl. .................................................. 324/123 R
[58] Field of Search .............................. 324/158.1, 73.1, 324/464, 123 R, 455, 123 C; 73/28.02, 861.07, 28.03; 330/290, 291, 292, 85, 86, 75; 367/140, 167, 172

[56] References Cited

U.S. PATENT DOCUMENTS

| | | | |
|---|---|---|---|
| 3,832,642 | 8/1974 | Helgeland | 324/123 C |
| 4,103,231 | 7/1978 | Nemcek, Sr. | 324/123 R |
| 5,153,502 | 10/1992 | Morgan et al. | 324/123 R |
| 5,153,519 | 10/1992 | Wentworth et al. | 324/123 R |

OTHER PUBLICATIONS

National Semiconductor (1990) *Linear Applications Handbook*, pp. 19, 49, 70 (no month available).

Wantanabe et al., "Sensitivity variation of Bayard–Alpert gauges and a quadrupole mass spectometer for hydrogen isotope molecules", *J. Vac. Sci. Technol.* A 5 (2), Mar/Apr. 1987.

N. T. Peacock, "Measurement of x–ray currents in Bayard–Alpert gauges", *J. Vac. Sci. Technol.* A 10 (4), Jul/Aug. 1992.

R. N. Peacock and N. T. Peacock, "Sensitivity variation of Bayard–Alpert gauges with and without closed grids from 10–4 to 1 Pa", *J. Vac. Sci. Technol.* A 8(4), Jul/Aug. 1990.

*Primary Examiner*—Vinh P. Nguyen
*Attorney, Agent, or Firm*—Lappin & Kusmer LLP

[57] ABSTRACT

The disclosed electrometer is of the type including an integrating amplifier and an electronically controlled switch. When the switch is closed, the electrometer is reset or cleared, and when the switch is open, the amplifier operates as an integrator. The switch is configured to substantially eliminate leakage currents between the switch and the inputs of the amplifier. The electrometer is operative for very small input currents and is operative over a wide dynamic range. The disclosed electrometer may be used to implement a highly accurate pressure transducer.

26 Claims, 4 Drawing Sheets

CHARGE RATE ELECTROMETER INCLUDING MEANS FOR SUBSTANTIALLY ELIMINATING LEAKAGE CURRENTS

FIELD OF THE INVENTION

The present invention relates generally to charge rate electrometers for measuring ion currents. More particularly, the invention relates to charge rate electrometers that are operative at very low input current levels and that have wide dynamic ranges.

BACKGROUND OF THE INVENTION

Various electrometers are known for measuring ion currents and often take the form of a circuit that converts an analog input current signal to an output voltage signal. The output voltage signal may be an analog signal or a digital signal, and in the latter case the electrometer functions as a form of analog-to-digital converter. Electrometers have many applications such as in pressure transducers used for measuring very low gas pressures (e.g., 1E-7 Torr to 1E-2 Torr). Such pressure transducers sometimes comprise an ion gauge (for example of the "hot cathode", "cold cathode", or "partial pressure" type) for generating an ion current signal that is representative of pressure. In such a transducer, the ion gauge is housed in a low pressure gaseous environment where it emits electrons, each of which has a probability of colliding with a gas molecule, the probability being related to the density of the gas. Each collision between an electron and a gas molecule generates an ion and the ions from all the collisions are collected and output as a collector current. The ion gauge may be modelled as a current source and the collector current output of the gauge is a function of the emission current (i.e., the number of electrons emitted by the gauge) and the density of the gas, and is therefore indicative of gas pressure. The collector current is applied to the input of an electrometer which in turn generates a voltage signal representative of the measured pressure. Such a pressure transducer may also include post processing components for generating control signals to, for example, adjust a valve in response to the measured pressure.

Figure 1:
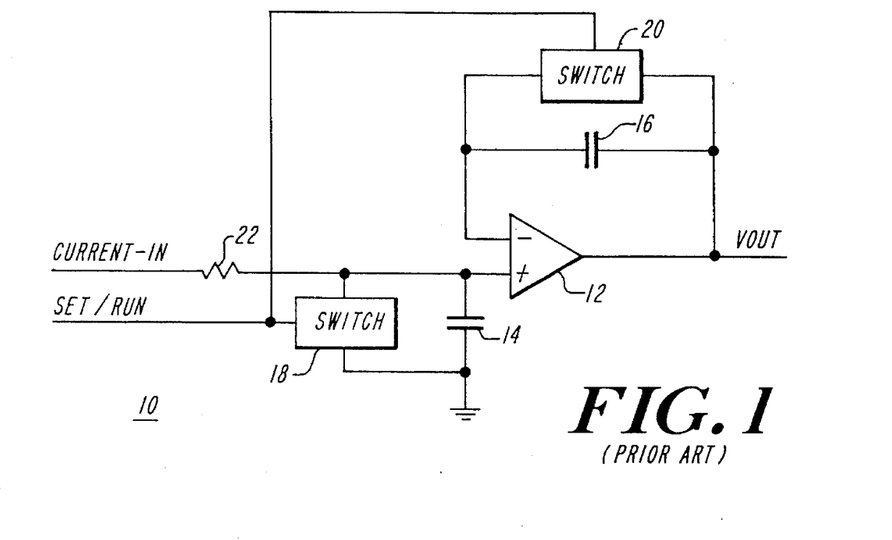
FIG. 1 is a schematic of a prior art electrometer.

FIG. 1 is a schematic of one prior art electrometer 10. Electrometer 10 receives two input signals, CURRENT-IN and SET/RUN, and generates a single output signal VOUT. The input signal CURRENT-IN is a current signal supplied by a current source (not shown) and may be the collector current generated by an ion gauge. The input signal SET/RUN is a control signal and the electrometer 10 operates in either a "run" mode or in a "set" mode depending on the state of the SET/RUN signal. Some form of controller (not shown) typically generates the input signal SET/RUN. When operating in the run mode, electrometer 10 generates the output voltage signal VOUT so that the value of VOUT is representative of the time integral of the input current signal CURRENT-IN. Electrometer 10 is operated in the set mode to "reset" (or "clear", or "initialize") the electrometer.

Electrometer 10 includes an operational amplifier 12 (having an inverting input, a non-inverting input and an output), two capacitors 14, 16, and two electronically controlled switches 18, 20. Capacitor 14 and switch 18 are coupled in parallel between the non-inverting input of amplifier 12 and ground. Capacitor 16 and switch 20 are coupled in parallel between the output and the inverting input of amplifier 12. The input signal CURRENT-IN is transmitted through a resistor 22 to the non-inverting input of amplifier 12, and the input signal SET/RUN is transmitted to the control inputs of switches 18, 20.

In operation, the controller (not shown) uses the input signal SET/RUN to control the state of switches 18, 20. When the switches 18, 20 are closed, electrometer 10 operates in the set mode, and when the switches 18, 20 are open, electrometer 10 operates in the run mode. The controller closes switches 18, 20 by setting the SET/RUN signal to a logical high value (e.g., five volts), and opens switches 18, 20 by setting the SET/RUN signal to a logical low value (e.g., ground).

When the switches 18, 20 are closed, (i.e., when electrometer 10 operates in the set mode) switch 18 couples the non-inverting input of amplifier 12 to ground and thereby clears any charge that may have built up on capacitor 14, and switch 20 couples the output of amplifier 12 to the inverting input of amplifier 12 and thereby clears any charge that may have built up on capacitor 16.

When switches 18, 20 are open, (i.e., when electrometer 10 operates in the run mode) amplifier 12 operates as a well known integrating amplifier so that the output voltage signal VOUT is related to and is a function of the capacitance of capacitors 14, 16, and the time integral of the input current signal CURRENT-IN. Since the capacitance values of capacitors 14, 16 are known and fixed, the value of the input current signal CURRENT-IN is proportional to and may be determined by monitoring the output voltage signal VOUT.

Figure 2A:
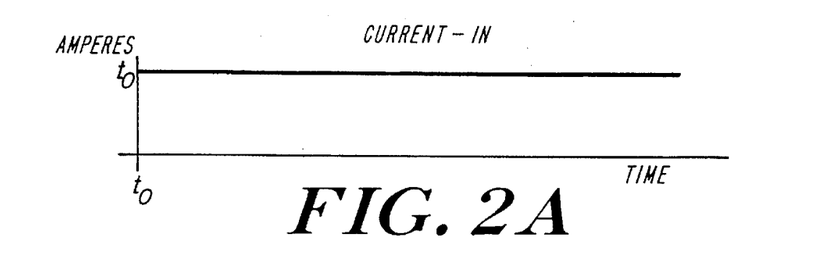
FIGS. 2A–C are graphs illustrating the operation of the electrometer shown in FIG. 1.
Figure 2B:
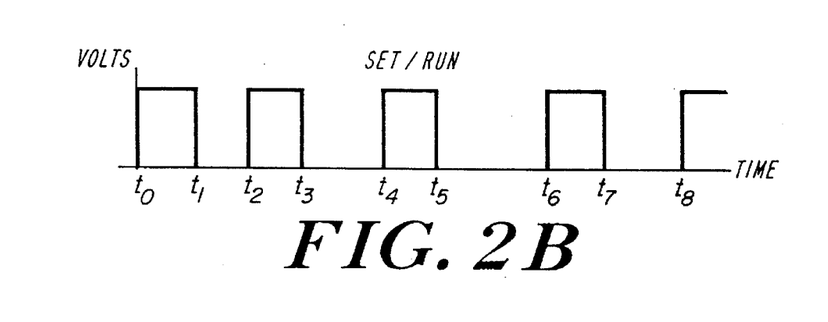
Figure 2C:
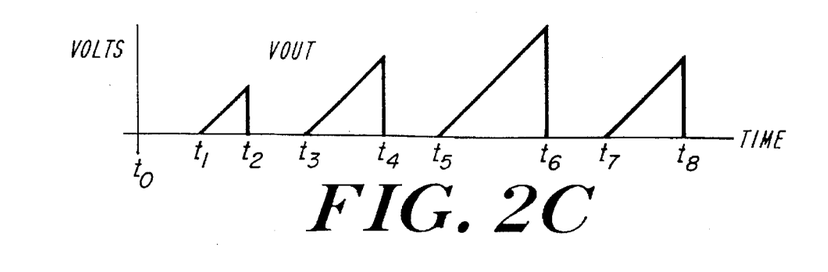

FIGS. 2A–C are graphs illustrating the idealized operation of electrometer 10. FIG. 2A is a graph of current verses time illustrating an exemplifying waveform for the input current signal CURRENT-IN. This waveform is a step function which starts at zero Amperes and at time $t_0$ increases to a current value of $I_0$ and then remains at the value $I_0$ for all time. FIG. 2B is a graph of voltage verses time illustrating an exemplifying waveform for the input control signal SET/RUN. FIG. 2C is a graph of voltage verses time illustrating the resulting output voltage signal VOUT. As can be seen from FIGS. 2A–C, when the input signal SET/RUN is set to a logical high value electrometer 10 operates in the set mode and the output voltage signal VOUT is set to ground, and when the input signal SET/RUN is set to a logical low value, electrometer 10 operates in the run mode and the output voltage signal VOUT increases as a function of the time integral of the input current signal CURRENT-IN.

One problem with prior art electrometers is of the type shown in FIG. 1 is that they do not function accurately when the input current signal is very small. For example, if the input signal CURRENT-IN applied to electrometer 10 is on the order of 1 pA (Pico Ampere), leakage currents in the switches 18, 20 (as well as parasitic capacitances and resistances of the switches) significantly affect the operation of amplifier 12 so that the output signal VOUT is not a reliable indicator of the input signal CURRENT-IN. For similar reasons, prior art electrometers of the type shown in FIG. 1 also typically do not function accurately over wide dynamic ranges.

Several techniques have been attempted to improve the dynamic range and signal sensitivity of prior art electrometers of the type shown in FIG. 1. One form of prior art electrometer uses what is sometimes known as a floating point amplifier which can include multiple amplifiers having different gains and "gain switching" techniques for selecting the gain as a function of the level of the input signal so as to provide reliable operation over a much wider dynamic range of input signal. This type of electrometer is generally disadvantageous because they use relays which are expensive and which have a relatively short mean time to failure and because they use relatively large resistors which are unstable. Another form of prior art electrometer exploits the logarithmic characteristic of P-N junctions to provide logarithmic amplifiers which operate over a wide dynamic range. While this type of electrometer operates over a wide dynamic range, they are generally disadvantageous because they use more than one amplifier and are therefor expensive, and they generally have only a relatively low accuracy.

In general, such prior art electrometers have several disadvantages. They are complex circuits using large numbers of electrical components and are therefore expensive to fabricate, and further they are susceptible to a wide variety of noise sources thereby reducing their utility, particularly for very small input signal levels. Also, they often generate an analog output signal which may not conveniently be applied to a digital circuit such as a digital computer. There is therefore a need for an inexpensive electrometer that is accurate over a wide dynamic range of input signal and that may operate reliably for very small input signal levels. There is also a need for such an electrometer which generates a digital output signal.

OBJECTS OF THE INVENTION

It is an object of the present invention to substantially reduce or overcome the above-identified problems of the prior art.

Another object of the present invention is to provide an improved electrometer.

And another object of the present invention is to provide an improved electrometer that is believed to be more accurate than provided by the prior art.

Yet another object of the invention is to provide an improved electrometer that is operative for very small input current signals.

Still another object of the present invention is to provide an improved electrometer that operates reliably over a very wide dynamic range of input signal.

Yet another object of the present invention is to provide an improved electrometer that is operative for input current signal levels in the range of 1 pA to 100 µA.

And another object of the present invention is to provide an improved electrometer that can be used in conjunction with an ion gauge to produce an accurate pressure transducer.

And yet another object of the invention is to provide an improved charge rate electrometer that is operated by measuring the time required for the output of the electrometer to exceed a predetermined threshold.

And still another object of the present invention is to provide an improved electrometer including components for guarding the inputs of the electrometer.

And yet another object of the present invention is to provide an improved electrometer that includes a reset device for selectively resetting the electrometer and for selectively allowing the electrometer to operate in a run mode, and a device for substantially eliminating leakage current between the reset device and the inputs of the electrometer.

And still another object of the present invention is to provide a signal converter for converting very low level analog currents to digital information which is readable by a CPU of a computer.

SUMMARY OF THE INVENTION

These and other objects are provided by an improved electrometer comprising an integrating amplifier and an electronically controlled switch. When the switch is closed, the electrometer is reset or cleared, and when the switch is open the amplifier operates as an integrator. The electrometer is configured to substantially eliminate leakage currents between the electronically controlled switch and the inputs of the integrating amplifier. The electronically controlled switch may be implemented using field effect transistors configured to guard the inputs of the integrating amplifier. In one aspect of the present invention, the output generated by the integrator is applied to the source of the field effect transistors coupled to the inputs of the amplifier, and a signal of equal voltage is applied to the drain of those transistors.

In accordance with another aspect of the invention, the electrometer may be used in an ion gauge pressure transducer. The pressure transducer may be implemented using the electrometer, a comparator, and a timer for measuring the time required for the output of the electrometer to exceed a threshold voltage.

Still other objects and advantages of the present invention will become readily apparent to those skilled in the art from the following detailed description wherein several embodiments are shown and described, simply by way of illustration of the best mode of the invention. As will be realized, the invention is capable of other and different embodiments, and its several details are capable of modifications in various respects, all without departing from the invention. Accordingly, the drawings and description are to be regarded as illustrative in nature, and not in a restrictive or limiting sense, with the scope of the application being indicated in the claims.

BRIEF DESCRIPTION OF THE DRAWINGS

For a fuller understanding of the nature and objects of the present invention, reference should be had to the following detailed description taken in connection with the accompanying drawings in which the same reference numerals are used to indicate the same or similar parts wherein.

DETAILED DESCRIPTION OF THE DRAWINGS

Figure 3:
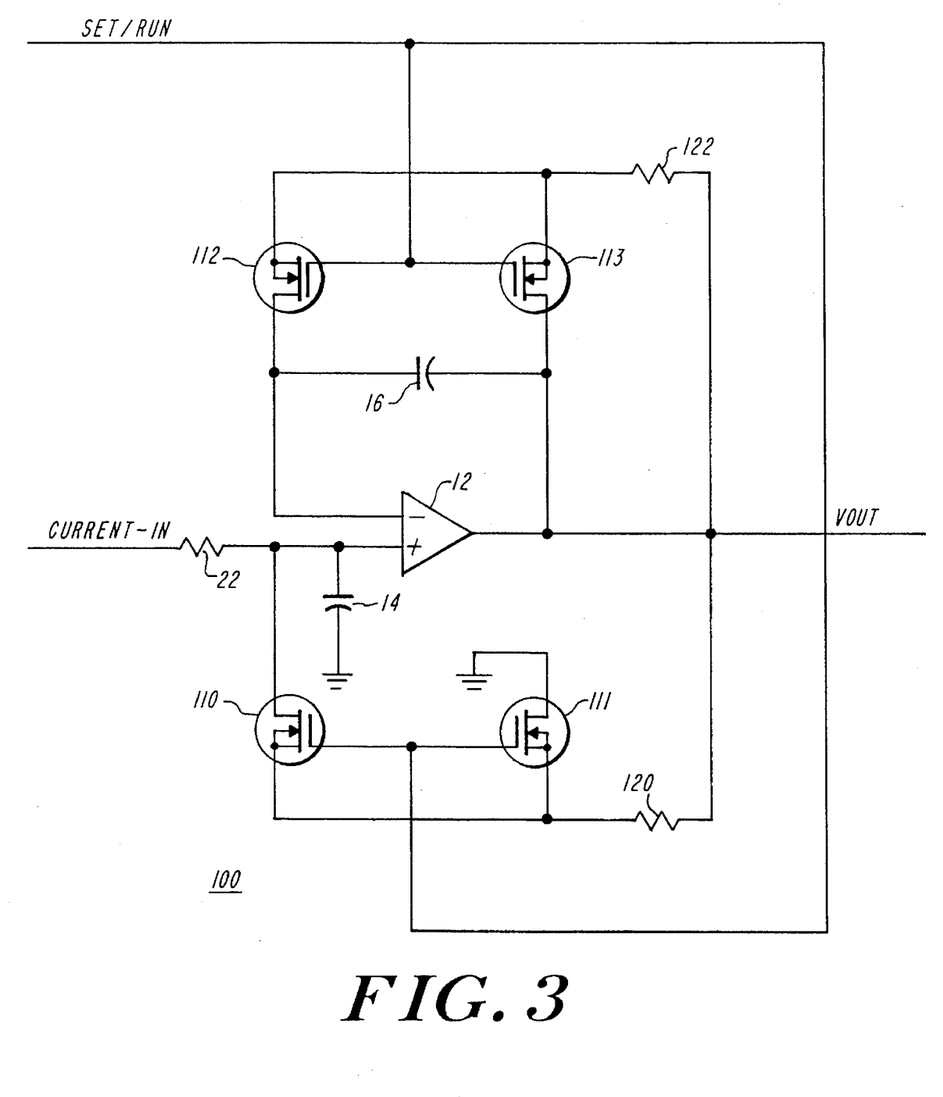
FIG. 3 is a schematic of an electrometer constructed in accordance with the invention.

FIG. 3 is a schematic illustrating one preferred embodiment of a charge rate electrometer 100 according to the invention. As will be discussed further below, electrometer 100 performs accurately for very small input signal levels and also performs accurately over a wide dynamic range of the input signal. More specifically, the device is particularly and preferably adapted to receive input signals at least as small as 1 pA (Pico Ampere) and at least as large as 100 µA (micro Amperes). Electrometer 100 may be used to construct a pressure transducer for sensing pressure within the range of 1E-10 Torr to 1E-2 Torr. For convenience, the operation of electrometer 100 will be discussed in connection with its use in a hot cathode ion gauge pressure transducer, although those skilled in the art will appreciate that this application is merely an example, and electrometer 100 may also be used in other types of ion gauge pressure transducers, as well as other applications for processing low level current signals.

Electrometer 100 includes the operational amplifier 12, input capacitor 14, feedback capacitor 16, and input resistor 22 configured as shown to form an integrating amplifier similar to that shown in FIG. 1. Electrometer 100 further includes four transistors 110–113 (each having a gate, a source, and a drain), and two resistors 120, 122. The input terminal SET/RUN for receiving a system reference potential is coupled to the gates of the four transistors 110–113, and the input current terminal CURRENT-IN is coupled through resistor 22 to the non-inverting input of amplifier 12. The drain of transistor 110 is coupled to the non-inverting input of amplifier 12 and the drain of transistor 111 is coupled to ground. The sources of transistors 110 and 111 are coupled together, and resistor 120 is coupled between the output of amplifier 12 and the sources of transistors 110–111. The drain of transistor 112 is coupled to the inverting input of amplifier 12 and the drain of transistor 113 is coupled to the output of amplifier 12. The sources of transistors 112 and 113 are coupled together and resistor 122 is coupled between the output of amplifier 12 and the sources of transistors 112–113. Preferably, for reasons which will be evident hereinafter, resistors 120 and 122 are matched.

A controller (not shown) drives the SET/RUN signal to a logical high value (e.g., five volts) to operate electrometer 100 in the set mode and thereby resets the electrometer. In the set mode, all four transistors 110–113 are in a conductive state (or an "on" state or a "closed" state), so that each transistor provides a low impedance path between its source and its drain. In the set mode, transistors 110–111 therefore provide a low resistance path between the non-inverting input of amplifier 12 and ground and thereby clear any charge that may have built up on capacitor 14. Similarly, when in the set mode, transistors 112–113 provide a low resistance path between the inverting input and the output of amplifier 12 and thereby clear any charge that may have built up on capacitor 16.

The controller (not shown) drives the SET/RUN signal to a logical low value (e.g., ground) to operate electrometer 100 in the run mode. In the run mode, all four transistors 110–113 are in a non-conductive state (or an "off" state or an "open" state), so that each transistor provides a high impedance path between its source and its drain, and thus allows amplifier 12 to operate as an integrating amplifier. Unlike electrometers of the prior art, electrometer 100 is configured to "guard" the inputs of amplifier 12 and thereby substantially reduce or eliminate any leakage currents flowing into or out of the inputs of amplifier 12.

In the run mode, with all four transistors in a nonconductive state, the input current signal CURRENT-IN tends to build up a voltage across capacitor 14 and thereby drives the voltage at the non-inverting input of amplifier 12 away from ground. As those skilled in the art of operational amplifiers will appreciate, amplifier 12 generates a voltage at its output (VOUT) that is equal to the voltage at its non-inverting input, and this voltage is also generated at the inverting input of amplifier 12 since operational amplifiers tend to minimize the difference in potential between their inputs. So during operation in the run mode, the voltages at the output, the inverting input, and the non-inverting input of amplifier 12 are all substantially equal to VOUT. Since the signal VOUT is also applied via resistors 120, 122 to the sources of transistors 110–113, the voltage levels at the source and drain of transistors 110, 112–113 are substantially equal. Since the voltages at the source and drain of transistor 110 are substantially equal, there is little or no tendency for current to flow through the transistor and any leakage current flowing between transistor 110 and the non-inverting input of amplifier 12 is therefore substantially eliminated. Similarly, since the voltages at the source and drain of transistor 112 are substantially equal, any leakage current flowing between transistor 112 and the inverting input of amplifier 12 is substantially eliminated. Since these leakage currents are substantially eliminated, electrometer 100 operates accurately even when the value of the input current signal CURRENT-IN is very small (i.e., as small as one Pico Ampere). Even though each transistor 110–113 may be rated as having a leakage current of greater than one Pico Ampere, accurate operation of electrometer 100 is possible for such small input current signal levels in part because each transistor is biased so as to substantially reduce any such leakage currents.

Figure 4:
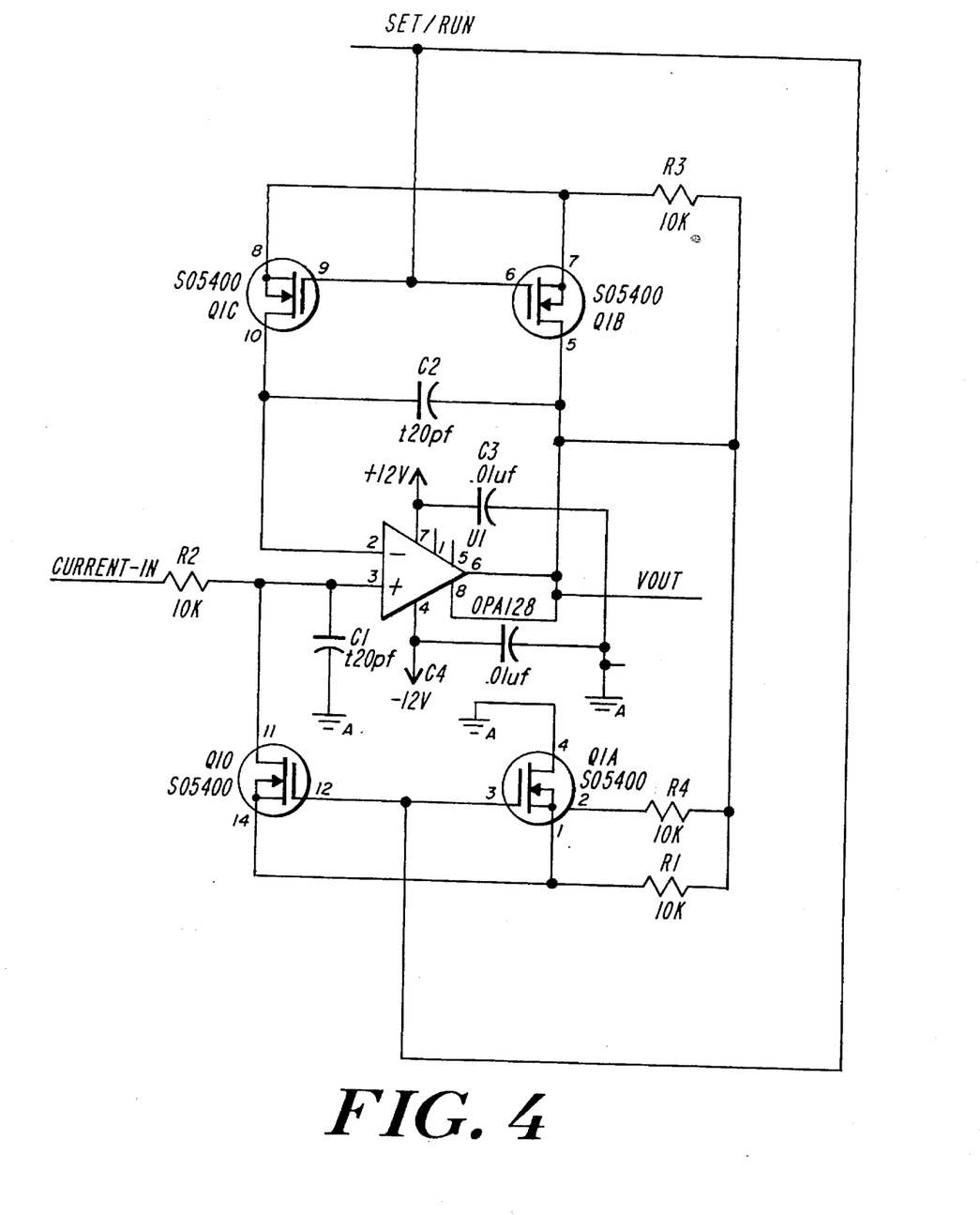
FIG. 4 is a detailed schematic of one embodiment of an electrometer constructed in accordance with the invention.

In the preferred embodiment, transistors 110–113 are implemented as field effect transistors (FETS), and may be implemented as DMOS type FETS, and capacitors 14, 16 are implemented as "NPO" type capacitors. In one preferred embodiment, the four transistors 110–113 are implemented using a single SD5400 integrated circuit (manufactured by SILICONIX of Santa Clara, Calif.), amplifier 12 is implemented using an OPA128 "can" type package (manufactured by BURR BROWN of Tucson, Ariz.), and capacitors 14, 16 are each 100 pF capacitors. FIG. 4 is a detailed schematic of this embodiment.

In another embodiment, electrometer 100 only includes three transistors and transistor 113 is eliminated. In this embodiment, the drain of transistor 112 is coupled to the inverting input of amplifier 12, the source of transistor 112 is coupled to the output of amplifier 12 via resistor 122, and the gate of transistor 112 is coupled to the input signal SET/RUN terminal. This embodiment also substantially eliminates leakage currents flowing between transistor 112 and the inverting input of amplifier 12 since the voltages at the source and drain of transistor 112 are both equal to VOUT when electrometer 100 is operated in the run mode. The SD5400 includes four transistors, so in the embodiment using this chip there is little advantage in not using all four transistors 110–113, however in other embodiments it may be advantageous to eliminate one transistor.

Figure 5:
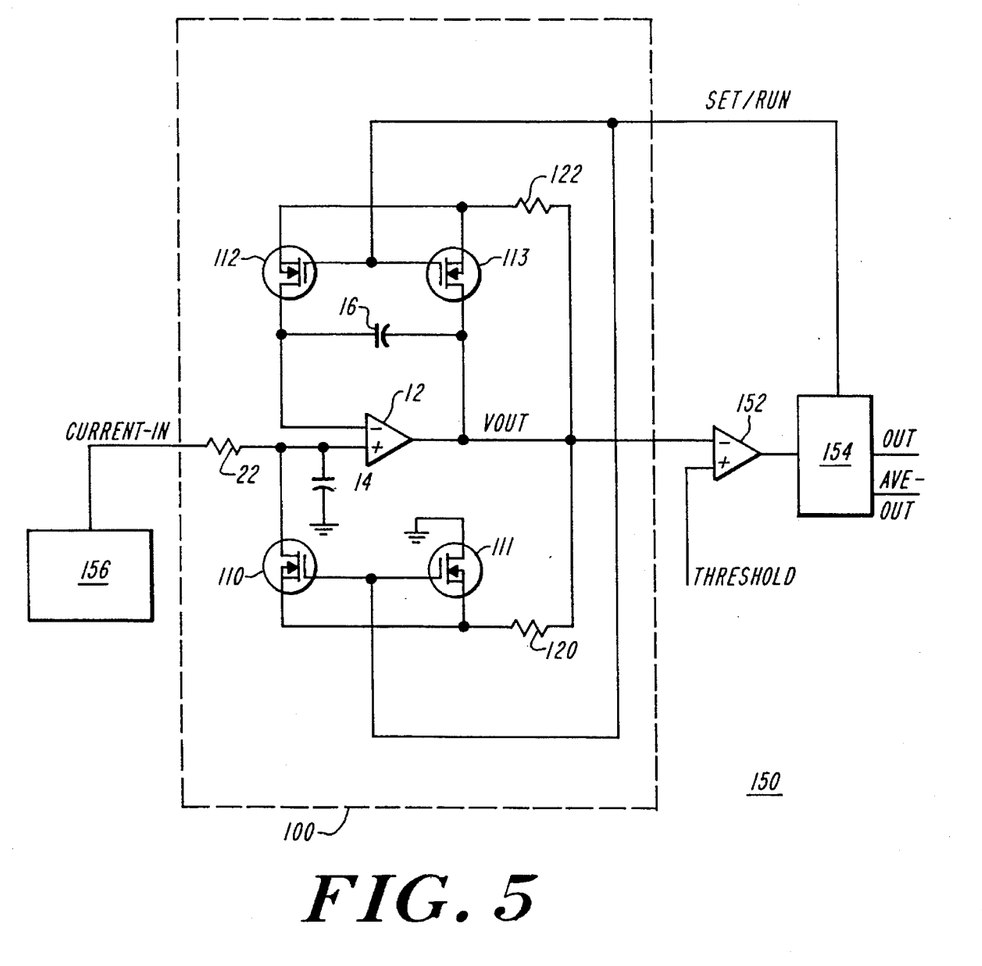
FIG. 5 is a schematic of a pressure transducer constructed in accordance with to the invention.

FIG. 5 is a schematic showing one preferred embodiment of a pressure transducer 150 including electrometer 100 as well as a comparator 152 and a microprocessor 154 for providing a charge rate electrometer current to pulse width convertor for converting the low current outputs of an ion gauge 156 to digital information which is readable by a CPU of a computer. The ion gauge 156 supplies an ion collector current signal, which is representative of a gas density measured by the gauge, to the input current signal CURRENT-IN terminal of electrometer 100. The voltage output VOUT of electrometer 100 is applied to the negative input of comparator 152 and the positive input of comparator 152 is connected to receive a voltage signal THRESHOLD which is set to a known, predetermined potential. The output of comparator 152 is coupled to an input of microprocessor 154, and an output of microprocessor supplies the SET/RUN input signal to electrometer 100.

In operation, the microprocessor 154 initially sets the SET/RUN signal to a logical high value to reset electrometer 100, i.e. clear capacitors 14 and 16 and then at a time $t_1$ sets the SET/RUN signal to a logical low value to allow electrometer 100 to operate in the run mode. Initially, the voltage at the negative input of comparator 152 (i.e., the value of VOUT) is less than the voltage at the positive input (i.e., the value of THRESHOLD) so the output of comparator 152 is a positive signal. As time passes, the value of VOUT increases in response to the value of the input current signal CURRENT-IN and eventually at a time $t_2$ the value of VOUT becomes greater than the value of THRESHOLD and the output of comparator 152 changes state to a negative signal. Since the value of VOUT is related to the time integral of the input current signal CURRENT-IN, the value of the CURRENT-IN signal may be calculated by measuring the time required for VOUT to become greater than THRESHOLD (i.e., the time interval between $t_1$ and $t_2$). Microprocessor 154 measures this time and generates a digital output signal OUT representative of the average value of the input current signal CURRENT-IN between times $t_1$ and $t_2$. Alternatively, since this current is indicative of gas pressure, microprocessor 154 may generate the signal OUT so that it is directly representative of the measured pressure. In one preferred embodiment, microprocessor 154 generates the signal OUT so that it is representative of the measured pressure according to the formula shown in Equation (1):

$$OUT = \frac{C(THRESHOLD)}{SI_e(t_2 - t_1)} \quad (1)$$

in which C is the capacitance of the capacitor 14, THRESHOLD is the threshold voltage, S is the sensitivity of the ion gauge 156, and $I_c$ is the emission current of the ion gauge 156. As is well known, the sensitivity of the ion gauge is computed by multiplying the collector current by the reciprocal of the product of the emission current and the pressure where these quantities are measured for a known gas pressure. In one preferred embodiment of transducer 150, ion gauge 156 has a sensitivity S of 9/Torr$^1$.

In one preferred mode of operation, microprocessor 154 repeats the basic operation of resetting electrometer 100 and calculating the signal OUT several times in rapid succession and generates a signal AVE-OUT equal to the average of the last N calculated values for OUT, where N is an integer such as five (although other integers could of course be used). In this mode, the signal OUT can be thought of as a measure of the instantaneous pressure and the signal AVE-OUT is a running average of instantaneous pressure measurements.

One preferred value for the signal THRESHOLD is 100 mV (millivolts). It takes about ten seconds for VOUT to rise from ground to 100 mV when the value of the CURRENT-IN signal is on the order of 1 pA, so for very small input current levels, transducer 150 takes a new measurement about once every ten seconds. When the value of the CURRENT-IN signal is on the order of 100 µA, then it only takes about 100 ns (nanoseconds) for VOUT to rise from ground to 100 mV. Since it is generally difficult for microprocessor 154 to accurately measure a time interval as short as 100 ns, transducer 150 preferably increases the value of the THRESHOLD signal to a second higher value for measuring higher input current levels. A preferred second value for THRESHOLD is 500 mV, and it takes about 500 ns for VOUT to rise from ground to 500 mV when the input current is 100 µA. Although microprocessor 154 can generally measure an interval on the order of 500 ns more accurately than it can measure an interval on the order 100 ns, 500 ns is still a relatively short interval for microprocessor 154 to measure accurately. One preferred method of improving the accuracy of transducer 150 for higher input current levels is to run microprocessor 154 in a "averaging loop" mode. In this mode, microprocessor 154 continuously measures the pressure and generates the signal OUT so that it is a running average of the last M measurements. One preferred value for M is one hundred in which case this mode of operation is referred to as the "hundred times loop" mode, although other values can of course be used for M. Another method of improving the accuracy of circuit 150 for higher input current levels is to use an even higher value for the THRESHOLD signal.

In a preferred mode of operation microprocessor 154 automatically selects the value for THRESHOLD based on the measured pressure. Yet another variable microprocessor 154 may control to improve the accuracy of transducer 150 is the emission current of the ion gauge. In one preferred mode of operation, for measuring pressures near the lower end of the range of the transducer (e.g., 1E-10 Torr to 1E-7 Torr), microprocessor 154 sets the emission current to a high value (e.g., 1 mA) and sets the THRESHOLD signal to a low value (e.g., 100 mV). For measuring pressures near the middle range of the transducer (e.g., 1E-7 Torr to 1E-4 Torr), microprocessor 154 sets the emission current to a lower value (e.g., 100 µA) and maintains the THRESHOLD signal at the low value (e.g., 100 mV). For measuring pressures near the upper end of the range of the transducer (e.g., 1E-4 Torr to 1E-2 Torr), microprocessor 154 maintains the emission current at the lower value (e.g., 100 µA) and sets the THRESHOLD signal to a higher value (e.g., 500 mV). Microprocessor 154 automatically switches between these three settings based on the measured pressure. Microprocessor 154 also preferably uses hysteresis to determine whether to switch between these settings so that the transducer does not dither between settings when the pressure hovers at any given value. For example, microprocessor 154 preferably switches from the higher emission current to the lower emission current at one pressure in the middle range (e.g., 1E-6 Torr), and switches from the lower emission current to higher emission current at a lower pressure (e.g., 1E-8 Torr), so if the pressure hovers around 1E-6 Torr, the transducer will only switch settings at most one time.

Thus, an improved electrometer is provided for measuring very small input current signals, and adapted to operate over a large dynamic range of input signals. The electrometer can easily be used in a ion gauge pressure transducer. The charge rate electrometer preferably is operated by measuring the time required for the output of the electrometer to exceed a predetermined voltage threshold. Components preferably in the form of transistors 110–113 are provided for guarding the inputs, including a SET/RUN input and a CURRENT-IN input, of the device. The transducer 100 of FIG. 5 thus provides a charge rate electrometer current to pulse width converter for converting low level currents to digital information readable by a CPU of a computer.

Since certain changes may be made in the above apparatus without departing from the scope of the invention herein involved, it is intended that all matter contained in the above description or shown in the accompanying drawing shall be interpreted in an illustrative and not a limiting sense.

What is claimed is:

1. An electrometer comprising:
    (A) amplifying means, including a first amplifier input terminal and an amplifier output terminal, for receiving an input current signal at the first amplifier input terminal and for generating an output voltage signal at the amplifier output terminal representative of the input current signal;
    (B) reference terminal means for receiving a system reference signal;
    (C) first reset means coupled between the first amplifier input terminal and said reference terminal means, the first reset means being operative in (1) a set mode for providing a low impedance path between the first amplifier input terminal and the reference terminal means, and (2) a run mode for providing a high impedance path between the first amplifier input terminal and the reference terminal means; and (D) means for applying a bias signal to the first reset means so as to substantially eliminate leakage current between the first amplifier input terminal and the first reset means when the first reset means is operative in the run mode and so as to substantially eliminate errors in said output voltage signal attributable to such leakage current.

2. An electrometer according to claim 1, the amplifying means further comprising first integrating means coupled between the first amplifier input terminal and the reference terminal means.

3. An electrometer according to claim 2, wherein the first integrating means comprises a capacitor.

4. An electrometer according to claim 2, the amplifying means further comprising a second amplifier input terminal, and second integrating means coupled between the second amplifier input terminal and the amplifier output terminal so that the amplifying means functions as an integrating amplifier.

5. An electrometer according to claim 4, wherein the second integrating means comprises a capacitor.

6. An electrometer according to claim 4, further comprising second reset means coupled between the second amplifier input terminal and the amplifier output terminal, the second reset means being operative in a set mode for providing a low impedance path between the second amplifier input terminal and the amplifier output terminal, and in a run mode for providing a high impedance path between the second amplifier input terminal and the amplifier output terminal.

7. An electrometer according to claim 6, further comprising means for applying a bias signal to the second reset means so as to substantially eliminate leakage current between the second amplifier input terminal and the second reset means when the second reset means is operative in the run mode so as to substantially eliminate errors in said output voltage signal attributable to such leakage current.

8. An electrometer according to claim 7, wherein the amplifying means includes an operational amplifier having an inverting input terminal defining the second amplifier input terminal, and a non-inverting input terminal defining the first amplifier input terminal.

9. An electrometer according to claim 7, wherein the first and second reset means are operative in response to a control signal, and wherein the first and second reset means are operative in the set mode when the control signal is in a first state, and the first and second reset means are operative in the run mode when the control signal is in a second state.

10. An electrometer according to claim 9, wherein the first reset means comprises a first transistor and a second transistor each having a gate, a source, and a drain, the gates of the first and second transistors being coupled to receive the control signal, and the drain of the first transistor being coupled to the first amplifier input terminal, and the drain of the second transistor being coupled to the reference terminal means and the means for applying a bias signal to the first reset means comprises means for coupling the source of the first transistor to the source of the second transistor and to the amplifier output terminal.

11. An electrometer according to claim 10, further comprising a resistor coupled between the amplifier output terminal and the sources of the first and second transistors.

12. An electrometer according to claim 10, wherein the first and second transistors are field effect transistors.

13. An electrometer according to claim 10, wherein the second reset means comprises a third transistor having a gate, a drain, and a source, the gate of the third transistor being coupled to receive the control signal, the drain of the third transistor being coupled to the second amplifier input terminal, and the means for applying a bias signal to the second reset means for coupling the source of the third transistor to the amplifier output terminal.

14. An electrometer according to claim 13, wherein the second reset means further comprises a fourth transistor having a gate, a drain, and a source, the gate of the fourth transistor being coupled to receive the control signal, the drain of the fourth transistor being coupled to the amplifier output terminal, and the means for applying a bias signal to the second reset means further comprises means for coupling the source of the fourth transistor to the source of the third transistor.

15. An electrometer according to claim 14, further comprising a resistor coupled between the amplifier output terminal and the sources of the third and fourth transistors.

16. An electrometer according to claim 14, wherein the third and fourth transistors are field effect transistors.

17. A transducer comprising:
(A) an electrometer including:
(i) integrating amplifier means, having an amplifier input terminal and an amplifier output terminal, for receiving an input current signal at the amplifier input terminal and for generating an output voltage signal at the amplifier output terminal representative of the integral of the input current signal;
(ii) reference terminal means for receiving a system reference signal;
(iii) reset means coupled between the amplifier input terminal and the reference terminal means, the reset means being operative in a set mode for providing a low impedance path between the amplifier input terminal and the reference terminal means, and in a run mode for providing a high impedance path between the amplifier input terminal and the reference terminal means; and
(iv) means for applying a bias signal to the reset means so as to substantially eliminate leakage current between the amplifier input terminal and the reset means when the reset means is operative in the run mode and so as to substantially eliminate errors in said output voltage signal attributable to such leakage current; and
(B) control means for selectively controlling the reset means to operate in the run mode or the set mode and including means for measuring a time interval between a first time when the control means controls the reset means to operate in the run mode and a second time when the output voltage signal becomes greater than a predetermined threshold voltage, wherein the time interval is representative of the input current signal.

18. A transducer according to claim 17, wherein the control means includes a comparator having a first comparator input and a second comparator input, the comparator generating an output signal indicative of whether a signal at the first comparator input is greater than a signal at the second comparator input, the first comparator input being coupled to the amplifier output terminal and the second comparator input being connected to receive the predetermined threshold voltage.

19. A transducer according to claim 18, wherein the control means includes processor means or receiving the output signal generated by the comparator and for generating in response to said output signal a digital output signal representative of the input current signal.

20. A transducer according to claim 19, wherein the means for measuring a time interval includes means for measuring the time interval at least N times in succession where N is an integer, and for generating a signal representative of the input current signal for each of the N measurements and for generating an output signal representative of the average of the N measurements of the input current signal.

21. A transducer according to claim 20, where N is equal to five.

22. A transducer according to claim 20, where N is equal to one hundred.

23. A transducer according to claim 17, further including an ion gauge coupled to the amplifier input terminal for generating the input current signal.

24. An electrometer comprising:
(A) an amplifier including an inverting input terminal, a non-inverting input terminal, and output terminal;
(B) a first capacitor electrically connected between said non-inverting input terminal and reference terminal means for receiving a system reference signal;
(C) a second capacitor electrically connected between said output terminal and said inverting input terminal;
(D) a first transistor and a second transistor each having a gate, a source and a drain, said first and second transistor gates being coupled together, said first and second transistor sources being coupled together, said first transistor drain being coupled to said non-inverting input terminal, said second transistor drain being coupled to said reference terminal means;
(E) a first resistor being electrically connected between said output terminal and said first and second transistor sources.

25. An electrometer according to claim 24, further including:
(A) a third transistor and a fourth transistor each having a gate, a source and a drain, said third and fourth transistor gates being coupled to said first and second transistor gates, said third and fourth transistor sources being coupled together, said third transistor drain being coupled to said inverting input terminal, said fourth transistor drain being coupled to said output terminal;
(B) a second resistor being electrically connected between said output terminal and said third and fourth transistor sources.

26. A electrometer according to claim 24, further including a third transistor having a gate, a source, and a drain, said third transistor gate being coupled to said first and second transistor gates, said third transistor source being coupled to said output terminal, and said third transistor drain being coupled to said inverting input terminal.

* * * * *